United States Patent [19]

Diehm et al.

[11] Patent Number: 4,823,283

[45] Date of Patent: Apr. 18, 1989

[54] STATUS DRIVEN MENU SYSTEM

[75] Inventors: Brian D. Diehm, Lake Oswego; James C. Stanley, Portland, both of Oreg.

[73] Assignee: Tektronix, Inc., Beaverton, Oreg.

[21] Appl. No.: 918,458

[22] Filed: Oct. 14, 1986

[51] Int. Cl.4 .............................................. G06F 3/153
[52] U.S. Cl. .................................... 364/518; 364/141; 364/146; 364/521
[58] Field of Search ............... 364/518, 521, 188, 487, 364/141, 146; 340/721; 324/76, 77 R, 121 R, 115

[56] References Cited

U.S. PATENT DOCUMENTS

| | | | |
|---|---|---|---|
| 4,396,977 | 8/1983 | Slater et al. ........................... | 364/188 |
| 4,449,186 | 5/1984 | Kelly et al. ....................... | 364/188 X |
| 4,479,197 | 10/1984 | Haag et al. ........................ | 364/188 X |
| 4,561,049 | 12/1985 | Deleganes et al. ............... | 364/188 X |
| 4,569,026 | 2/1986 | Best ...................................... | 364/521 |
| 4,713,656 | 12/1987 | Cliff et al. ........................ | 340/721 X |

Primary Examiner—Gary V. Harkcom
Assistant Examiner—Mark K. Zimmerman
Attorney, Agent, or Firm—John P. Dellett; Peter J. Meza

[57] ABSTRACT

Menus displayed on a screen of an instrument permit an operator to adjust and monitor the operating state of the instrument. Various menus are added and removed from the display in response to changes in the operating state of the instrument so that those menus appropriate for the operating state of the instrument are automatically displayed while inappropriate menus are automatically removed from the display. Displayed menu items may be added, removed or modified in response to changes in the operating state of the instrument, as evidenced by changes in the configuration parameters, so that only those menu items which are appropriate to a given operating state are displayed.

9 Claims, 9 Drawing Sheets

HIMMnuTmplStr (in ROM)

| MnuTyp | Short |
|---|---|
| LckFlg | Bool |
| DynFlg | Bool |
| DispFn | Fn Ptr |
| EntryFn | Fn Ptr |
| ExitFn | Fn Ptr |
| Formatted | Ptr |

FIG. 5

HIMMnuFmtStr

| MnuTyp | Short |
|---|---|
| MnyLft | Short |
| MnuTop | Short |
| InstanceNext | Short |
| MnuUnig | Union |
| DispFn | Fn Ptr |
| EntryFn | Fn Ptr |
| ExitFn | Fn Ptr |
| EntChn | Ptr |

→ TO FIRST FORMATTED ENTITY

FIG. 6

HIMOutTmplStr

| EntTyp | Short |
|---|---|
| DispFn | Fn Ptr |
| StevesArg | Short |
| PlaceCode | Short |
| PlaceX | Short |
| PlaceY | Short |
| FColorIndex | Short |
| BColorIndex | Short |
| OutFldNo | Short |

FIG. 15

HIMOutFmtStr

| NxtEnt | Ptr |
|---|---|
| EntTyp | Short |
| DispFn | Fn Ptr |
| DispRslt | Bool |
| StevesArg | Short |
| PlaceCode | Short |
| PlaceX | Short |
| PlaceY | Short |
| FColorIndex | Short |
| BColorIndex | Short |
| OutFldNo | Short |

FIG. 16

| HIMSelTmplStr | |
|---|---|
| EntTyp | Short |
| PlaceHold | Bool |
| DispFn | Fn Ptr |
| SlctFn | Fn Ptr |
| HilitFn | Fn Ptr |
| ColorExcept | Bool |
| FColorIndex | Short |
| BColorIndex | Short |
| Width | Short |
| Height | Short |
| StevesArg | Short |
| PlaceCode | Short |
| PlaceX | Short |
| PlaceY | Short |
| Overlayed | Bool |
| OutFldFn | Fn Ptr |
| OurFldChr | Short |
| Actions | Struct |
| Txtcon | Short |
| SelUniq | Union |

| HIMActPtrStr | |
|---|---|
| NewMsg | Ptr |
| NewPopop | Ptr |
| DelPopup | Bool |
| NonMnuAct | Fn Ptr |
| NonMnuArg | Ptr |

FIG. 7

| HIMSelFmtStr | |
|---|---|
| NxtEnt | Ptr |
| EntTyp | Short |
| Placehold | Bool |
| LocateX | Short |
| LocateY | Short |
| Width | Short |
| Heigth | Short |
| DispFn | Fn Ptr |
| DisRslt | Bool |
| SlctFn | Fn Ptr |
| SelRslt | Bool |
| HilitFn | Fn Ptr |
| HilitRslt | Bool |
| Overlayed | Bool |
| ColorExcept | Bool |
| FColorIndex | Short |
| BColorIndex | Short |
| OutFldFn | Fn Ptr |
| OutFldX | Short |
| OutFldY | Short |
| OutFldNo | Short |
| Actions | Struct |
| StevesArg | Short |
| TxtIcon | Short |
| InstanceBase | Short |
| InstanceMax | Short |
| BlankState | Short |
| SelUniq | Union |

| HIMActPtrStr | |
|---|---|
| NewMsg | Ptr |
| NewPopop | Ptr |
| DelPopup | Bool |
| NonMnuAct | Fn Ptr |
| NonMnuArg | Ptr |

FIG. 8

| HIMLstTmplStr | |
|---|---|
| EntTyp | Short |
| PlaceHold | Bool |
| DispFn | Fn Ptr |
| SlctFn | Fn Ptr |
| HilitFn | Fn Ptr |
| EnvLft | Short |
| EnvTop | Short |
| MaxEnvWidth | Short |
| MaxEnvHeight | Short |
| Overlayed | Bool |
| StevesArg | Short |
| SelWidth | Short |
| SelHeight | Short |
| LstLen | Fn Ptr |
| TxtFn | Fn Ptr |
| Actions | Struct |

| HIMActPtrStr | |
|---|---|
| NewMsg | Ptr |
| NewPopop | Ptr |
| DelPopup | Bool |
| NonMnuAct | Fn Ptr |
| NonMnuArg | Ptr |

FIG. 9

| HIMLstFmStr | |
|---|---|
| NxtEnt | Ptr |
| EntTyp | Short |
| PlaceHold | Bool |
| EnvLft | Short |
| EnvTop | Short |
| ActEnvWidth | Short |
| ActEnvHeight | Short |
| DispFn | Fn Ptr |
| DispRslt | Bool |
| SlctFn | Fn Ptr |
| SlctRslt | Bool |
| HilitFn | Fn Ptr |
| HilitRslt | Bool |
| Overlayed | Bool |
| SelWidth | Short |
| SelHeight | Short |
| LstLen | Fn Ptr |
| TxtFn | Fn Ptr |
| InstanceBase | Short |
| InstanceMax | Short |
| BlankState | Ptr |
| Actions | Struct |
| StevesArg | Short |
| LstStart | Short |
| LstAdjust | Short |

| HIMActPtrStr | |
|---|---|
| NewMsg | Ptr |
| NewPopop | Ptr |
| DelPopup | Bool |
| NonMnuAct | Fn Ptr |
| NonMnuArg | Ptr |

FIG. 10

HIMRulTmplStr

| EntTyp | Short |
|---|---|
| PlaceHold | Bool |
| DispFn | Fn Ptr |
| StevesArg | Short |
| PlaceCode | Short |
| PlaceData | Union |
| ColorIndex | Short |
| LineTypFn | Fn Ptr |
| LineTyp | Short |

FIG. 11

HIMTxtTmplStr

| EntTyp | Short |
|---|---|
| PlaceHold | Bool |
| DispFn | Fn Ptr |
| PlaceCode | Short |
| PlaceX | Short |
| PlaceY | Short |
| Overlayed | Bool |
| FColorIndex | Short |
| BColorIndex | Short |
| StevesArg | Short |
| TxtIcon | Short |
| TxtUniq | Union |

FIG. 13

HIMRulFmtStr

| NxtEnt | Ptr |
|---|---|
| EntTyp | Short |
| PlaceHold | Bool |
| DispFn | Fn Ptr |
| DispRslt | Bool |
| StevesArg | Short |
| StartX | Short |
| StartY | Short |
| EndX | Short |
| EndY | Short |
| InstanceNo | Short |
| ColorIndex | Short |
| LineTypFn | Fn Ptr |
| LinTyp | Short |

FIG. 12

HIMTxtFmtStr

| NxtEnt | Ptr |
|---|---|
| EntTyp | Short |
| PlaceHold | Bool |
| DispFn | Fn Ptr |
| DispRslt | Bool |
| PlaceX | Short |
| PlaceY | Short |
| Overlayed | Bool |
| FColorIndex | Short |
| BColorIndex | Short |
| StevesArg | Short |
| TxtIcon | Short |
| TxtInstance | Short |
| TxtLen | Short |
| TxtUniq | Union |

FIG. 14

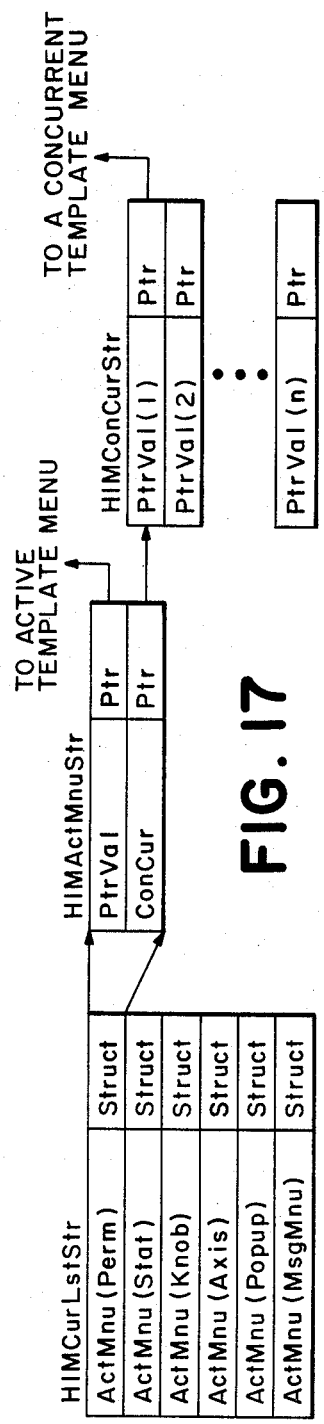
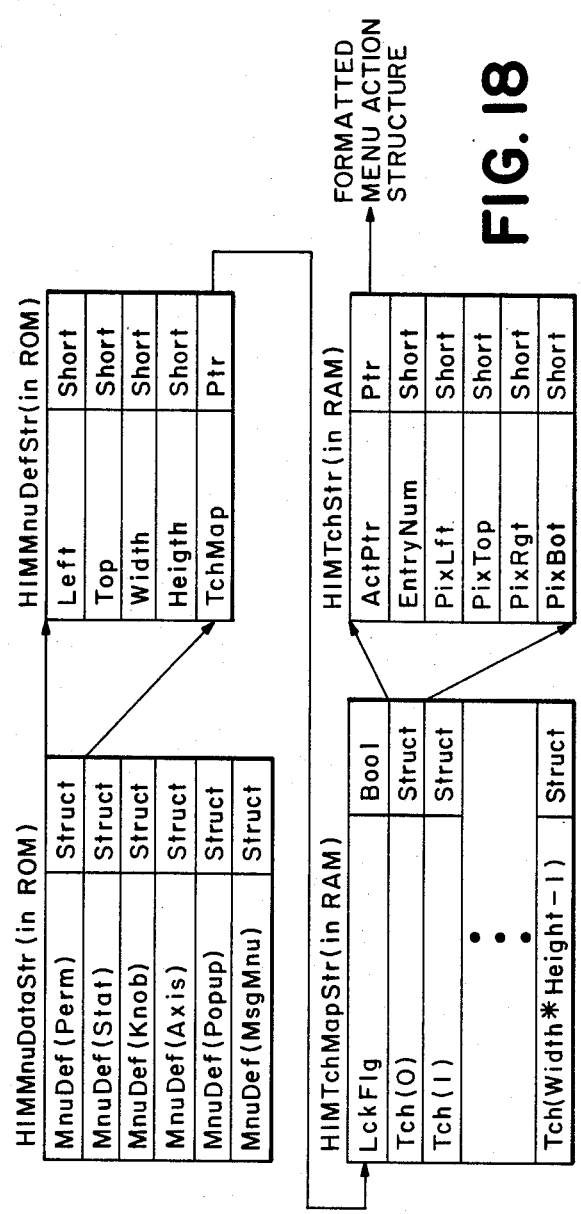
FIG. 17
FIG. 18

STATUS DRIVEN MENU SYSTEM

BACKGROUND OF THE INVENTION

The present invention relates in general to systems for configuring the operating state of an instrument and in particular to a system permitting an operator to control instrument configuration by making selections from menus displayed on a screen.

In recent years the number of selectable operating modes for instruments such as oscilloscopes, logic analyzers and the like has greatly increased. For example, many oscilloscopes permit the display of selectable numbers of traces, and each trace ay utilize one of many internally or externally generated time base signals for horizontal control and one of two or more vertical input channels for vertical trace control. Each vertical input channel may have selectable probe coupling and termination modes and may also permit selection between input signal inverting and noninverting modes. Sweep delay modes may be selected wherein a sweep signal controlling one trace is delayed by a selectable time following initiation of a sweep signal controlling another trace.

The advent of computer-based oscilloscopes has permitted a rapid growth in the number of functions which an oscilloscope may perform. For example, a computer-based oscilloscope may utilize selected digitized waveform data stored in a memory to control waveform display, may synthesize such waveform data on the basis of user-defined mathematical expressions, may self-calibrate portions of its circuitry, or may perform numerical measurements on digitized wveform data and display the results.

As the number of selectable oscilloscope operating modes has increased, so have the number and complexity of control pushbuttons and knobs on oscilloscope front panels. Eventually, microcomputer-based oscilloscopes were programmed to display menus listing various operating modes and permitting an operator to choose from among listed operating modes utilizing pushbuttons on the oscilloscope front panel to indicate menu selections. Use of such menus permitted a reduction in the number of pushbuttons needed because the same set of pushbuttons could be utilized to make selections from several alternatively displayable menus.

Many different menus are required to configure the operating state of a complex oscilloscope capable of carrying out plural operations, particularly when the oscilloscope may be configured to carry out each operation in several different ways. Since it is normally impractical to display more than a few menus at a time, menus are often arranged into a "menu tree" wherein a "master" menu enables an operator to select a "mode" menu from among a set, each mode menu including selections enabling the operator to configure the operating mode of a particular oscilloscope operation. Once a particular mode menu is selected, it is displayed, and the operator may make selections from the mode menu to configure a particular aspect of oscilloscope operation. In complex oscilloscopes the operator may be required to traverse several levels of master menus in order to locate and make selections from a particular mode menu, and this renders the configuration of the oscilloscopes operating state time consuming and difficult to learn.

In the case of such a menu tree, each mode menu includes a fixed set of selectable menu items, but it may also be that when the oscilloscope is in a particular operating state, some or all of the menu items should not be selected because the menu items may control operations incompatible with the current operating state of the oscilloscope. Thus while an operator may cause a particular mode menu to be displayed, the operator may be unaware that selections from the menu may have no effect, or may have an unanticipated effect, depending on the current operating state of the oscilloscope.

SUMMARY OF THE INVENTION

In accordance with one aspect of the present invention, menus permitting an operator to adjust and monitor the operating state of an instrument are automatically selected to be added ore removed from a display screen in response to changes in the operating state of the instrument. When the operator selects a menu item on a displayed menu, a "configuration command" is generated invoking a procedure which changes values of one or more stored "configuration parameters". The values of the stored configuration parameters, which control the operating state of the instrument, may also be changed in response to configuration commands generated in response to other input devices, such as, for example, knobs or pushbuttons mounted on the instrument, or in response to signals transmitted to the instrument from external sources. Data indicating combinations of configuration parameter values for which each menu is to be displayed are stored in a memory and, when the value of any configuration parameter changes, the menu management system of the present invention consults this data, determines which menus are to be added or removed from the display based on the current configuration parameter values, and updates the menu display accordingly. Thus when the operating state of the instrument changes, menus appropriate for the new operating state are automatically displayed while menus inappropriate for the instrument operating state are automatically removed from display. This aspect of the invention minimizes the need for an operator to manually select the appropriate menus to be displayed for a given instrument operating state.

In accordance with another aspect of the invention, the menu management system is adapted to add, remove or modify menu items of a displayed menu in response to changes in the configuration parameters so that only those menu items which are appropriate to a given operating state are displayed. This aspect of the invention enables an operator to easily determine which instrument configuration choices are currently available for the current instrument operating state and prevents display of irrelevant or misleading information on the instrument screen.

It is accordingly an object of the invention to provide an improved system for configuring the operating state of an instrument.

It is another object of the invention to provide an improved system for automatically controlling the display of menus for configuring and indicating the operating state of an instrument.

The subject matter of the present invention is particularly pointed out and distinctly claimed in the concluding portion of this specification. However, both the organization and method of operation of the invention, together with further advantages and objects thereof, will best be understood by reference to the following description taken in connection with accompanying drawings.

DRAWINGS

FIGS. 5-18 illustrate data structures maintained by the human interface subsystem of FIG. 4.

DETAILED DESCRIPTION

Figure 1:
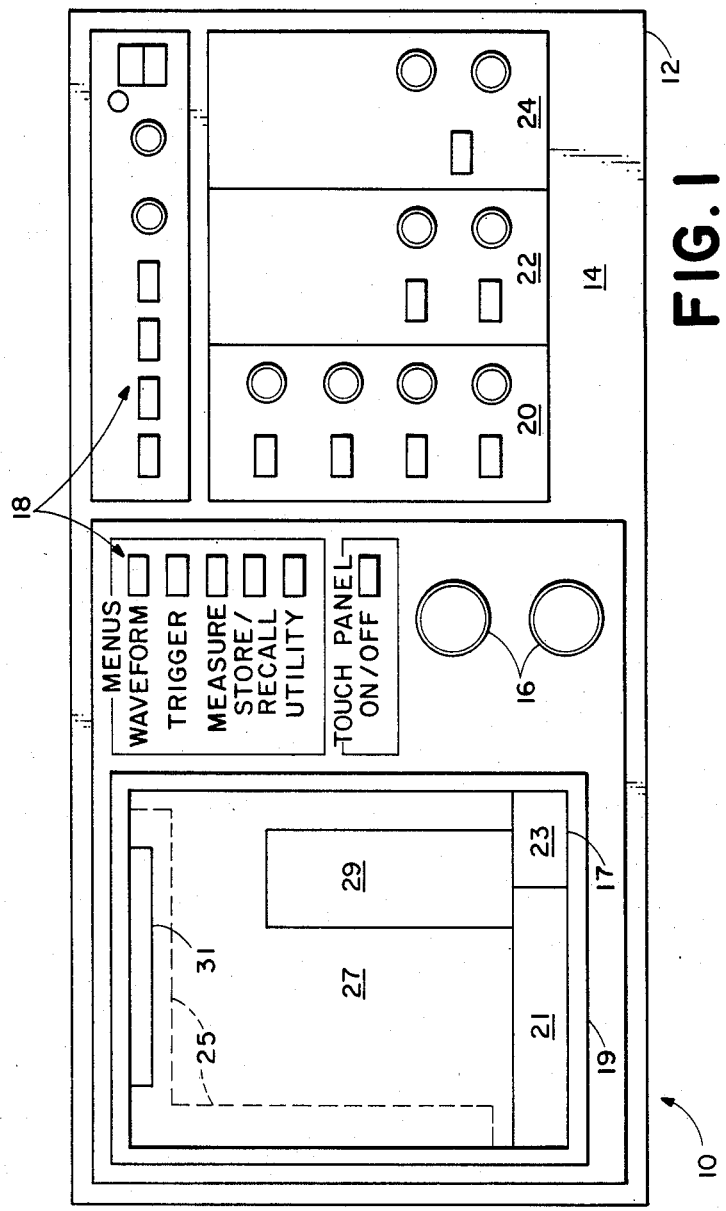
FIG. 1 is a front elevation view of an oscilloscope utilizing the present invention.

The present invention relates to a method and apparatus for controlling the operating state of computer-based instrumentation systems such as oscilloscopes, logic analyzers and the like. Referring to FIG. 1, a front elevation view of an example of one such instrumentation system, a microcomputer-based digitizing oscilloscope 10, is depicted. Oscilloscope 10 includes a main chassis 12, a front panel 14 mounted on the chassis, knobs 16, a screen 17 and pushbuttons 18 mounted on the front panel, as well as a set of three "plugins" 20, 22 and 24. Each plugin comprises a hardware subsystem of the oscilloscope mounted on a small, removable chassis "plugged" into main chassis 12 through a corresponding slot in front panel 14. The plugin hardware subsystems, interconnected with other hardware within chassis 12 through backplane wiring in chassis 12, may include vertical channel amplifiers, trigger systems and other equipment. Each plugin includes an individual front panel on which additional pushbuttons, control knobs and jacks may be mounted. The screen 17 is adapted to display waveforms, menus, data and other graphics and textg produced by the oscilloscope and includes a well-known "touch screen" 19 mechanism comprising rows of light sources and light sensors distributed around the edge of the screen providing control input signals to the oscilloscope indicating locations on the screen touched by an operator's finger. The touch screen 19 is used primarily to permit an operator to make selections from menus displayed on the screen.

Figure 2:
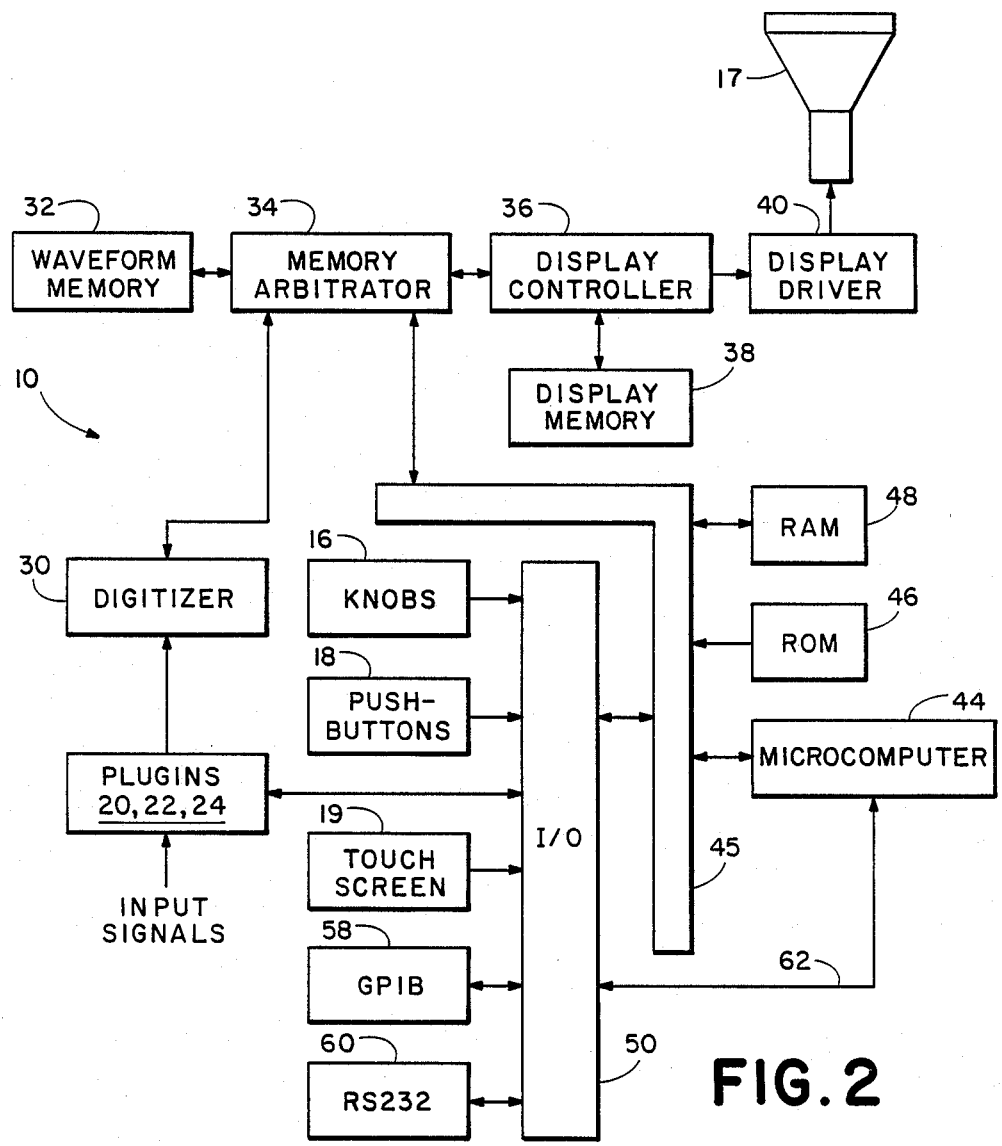
FIG. 2 is a block diagram of hardware associated with the oscilloscope of FIG. 1.

FIG. 2 is a block diagram of hardware associated with the oscilloscope 10 of FIG. 1. Signals produced by devices under test and applied as input to oscilloscope 10 through jacks on plugins 20, 22 and 24 are preconditioned by the plugins and applied as waveform and triggering inputs to a digitizer 30. The digitizer 30 digitizes selected input signals to produce sequences of waveform data representing the magnitude of successive waveform samples, and transmits these waveform data sequences for storage in a waveform memory 32 by way of a memory arbitrator 34 which arbitrates competing demands for access to the waveform memory 32. Through memory arbitrator 34, a display controller 36 acquires selected waveform data sequences stored in waveform memory 32 and utilizes these sequences to create a bit map of an oscilloscope display, the bit map being stored in a display memory 38. The display controller 36 periodically acquires bit map information from the display memory 38 and transmits it to a display driver 40 which produces a display on the cathode ray tube screen 17 of the oscilloscope 10 according to bit map data.

The memory arbitrator 34 also provides microcomputer 44 with read and write access to waveform memory 32 by way of a computer bus 45 including control, data and address lines. Microcomputer 44 suitably comprises an Intel model 80286 microprocessor and may include an Intel 80287 arithmetic coprocessor for performing fast arithmetic operations and an Intel 82258 direct memory access (DMA) controller for fast I/O operations. The microcomputer 44, operating under control of software (sometimes called "firmware") stored in a read only memory (ROM) 46, is programmed to carry out a number of functions including, for example, the control of operating states of plugins 20, 22 and 24, digitizer 30, and display controller 36 as hereinafter described. The microcomputer 44 provides control input signals to plugins 20, 22, and 24 through bus 45 as hereinafter described to which the plugins are connected by means of suitable bus input/output (I/O) interface circuitry 50. Microcomputer 44 also controls digitizer 30 operating modes through commands sent over bus 45 and stored in waveform memory 32 by way of memory arbitrator 34, the stored commands being subsequently read out of memory 32 by digitizer 30. Microcomputer 44 determines which stored waveform data sequences display controller 36 is to display by sending commands to memory arbitrator 34 telling it to obtain selected waveform sequences from memory and to transmit them to the display controller 36. Microcomputer 44 also controls the display of menus, graphics and data on screen 17 by storing data in waveform memory 32 and commanding arbitrator 34 to forward that data to the display controller 36.

Input signals, produced by operation of the oscilloscope main front panel knobs 16 and pushbuttons 18, by operation of knobs, pushbuttons or switches on the individual front panels of plugins 20, 22, or 24, and by operation of the touch screen 19, are sensed by the I/O circuitry 50 which transmits messages to microcomputer 44 in response thereto. In response to the messages, microcomputer 44 configures various subsystems of the oscilloscope for selected modes of operation. The I/O circuitry 50 also provides an interface between bus 45 and two external buses, a general purpose interface bus (GPIB) 58 and RS232 bus 60, buses 58 and 60 being accessable through pin connectors at the rear of the oscilloscope chassis. Buses 58 and 60 provide a path for communication between the oscilloscope 10 and external equipment such as a remote computer. A remote computer may, for example, provide control signals over bus 58 or bus 60 for configuring the oscilloscope 10, for carrying out selected operations and for obtaining through bus 58 or bus 60 test data acquired by oscilloscope 10 in the course of carrying out such operations. The I/O circuitry 50 converts ASCII messages transmitted on buses 58 or 60 to ASCII messages sent to microcomputer 44 and converts ASCII messages from microcomputer 44 to ASCII messages for transmission over buses 58 or 60. The I/O circuitry 50 also permits external equipment connected to the oscilloscope through buses 58 or 60 to access interrupt and direct memory access control lines 62 of microcomputer 44 so that the external equipment can interrupt microcomputer 44 and/or gain direct memory access to RAM 48.

The microcomputer 44 may be programmed to carry out a number of operations involving computations. For example, the microcomputer may acquire one or more digital waveform data sequences from waveform memory 32, combine the data sequences according to a user-defined mathematical expression to produce a "synthesized" waveform data sequence, store the synthesized data sequence in waveform memory 32, and then cause display controller 36 to display a synthesized waveform described by the stored data sequence. The synthesized waveform might, for example, represent the sum of two digitized input waveforms also displayed on the screen, the integral of a digitizes input waveform, or any other function of a waveform. The microcomputer 44 can also calculate synthesized waveform data on the basis of a user-defined mathematical expression which does not operate on data from waveform memory 32. For example, the microcomputer may calculate waveform data representing a simple sine wave or square wave and store that data in waveform memory 32 for subsequent use in creating a waveform display. The microcomputer 44 may also be programmed to enable the oscilloscope to perform various "measurements" on waveform data sequences stored in memory 32 such as, for example, determining the peak of RMS values of an input signal represented by the digitized waveform data, the results being displayed on screen 17.

The hardware architecture of FIG. 2, particularly the use of plugins, allows hardware subsystems to be added, removed, or modified with little or no change to the oscilloscope chassis or other hardware subsystems of the oscilloscope. Various software controlled operations of the oscilloscope can be added or changed by replacing ROM 46 with a new ROM containing different software (firmware). The hardware architecture of FIG. 2 permits the response of the oscilloscope to operation of knobs, pushbuttons and touch screen inputs to be determined by software rather than by hardwired connections and this enables oscilloscope response to a signal from one of these input sources to be changed "on the-fly" so that any particular input signal source may control more than one oscilloscope operating parameter. For example, in one operating state the oscilloscope may determine and display data representing the magnitude of a displayed waveform at a point along the waveform indicated by a cursor on the screen, and one of the knobs 16 of FIG. 1 may control the position of that cursor. In another oscilloscope operating state, the same knob 16 may be utilized to set the value of a parameter controlling trigger delay. As another example, the effect of an operator touching a point on touch screen 19 may vary depending on which of several menus may be displayed on the screen.

Figure 3:
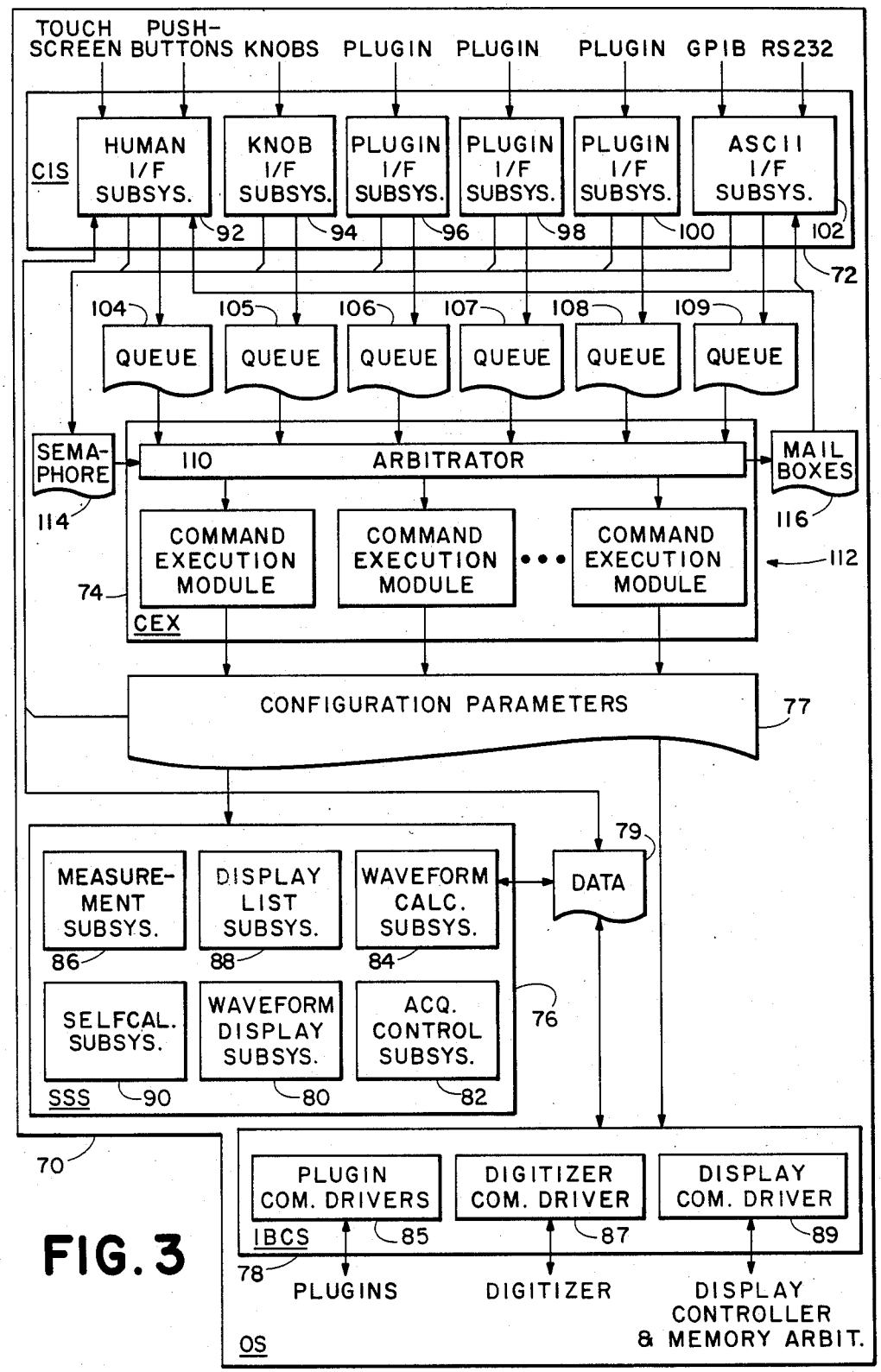
FIG. 3 is a data flow diagram showing operation of software systems controlling the oscilloscope of FIGS. 1 and 2.

Software in ROM 46 for controlling the operating state configuration and steady state operation of the oscilloscope is organized according to a flexible architecture which accommodates changes in hardware and software-based oscilloscope operations without extensive software modification. Referring to FIG. 3, depicting this software architecture in data flow diagram form, oscilloscope software is organized into an operating system (OS) 70, a control interface system (CIS) 72, a command execution system (CEX) 74, a steady state system (SSS) 76, and an interboard communication system (IBCS) 78. The control interface system 72, command execution system 74, steady state system 76 and interboard communication system 78. Each system comprises tasks which run within an operating environment provided by the operating system 70, and the operating system multiplexes the microcomputer through these tasks on a "time slice" basis so that tasks run in a substantially "concurrent" fashion. The operating system 70 also manages allocation of storage space in random access memory 48 of FIG. 2, syncronizes access to common data structures by the various tasks to provide task-to-task communications, provides I/O interfacing, and maintains a set of timers for controlling periodic activities.

The steady state system 76 includes a set of software subsystems running as concurrent tasks within the operating system 70, each subsystem operating in a mode set according to the values of one or more "configuration parameters" 77 stored in RAM 48 of FIG. 2. A waveform display subsystem 80 controls the transfer of waveform data from the waveform memory 32 to the display controller 36 of FIG. 2. The digitizer 30 of FIG. 2 includes an internal computer which may be programmed to stop digitizing a particular input waveform and to transmit an "acquisition stopped" message to microcomputer 44 when predetermined conditions (such as for example receipt of a given number of triggers) have been fulfilled. An acquisition control subsystem 82 of the steady state system 76 of FIG. 3 responds to the "acquisition stopped" message by executing a routine which may be configured to cause the newly acquired waveform data to be displayed on the screen. A waveform calculation subsystem 84 calculates the previously mentioned synthesized waveform data according to user-defined expressions, and a measurement subsystem 86 determines attributes of selected input waveforms (such as peak values, rise times, etc.) from digitized input waveform data stored in the waveform memory. A display list subsystem 88 controls the display of the results of measurements performed by the measurement subsystem 86, and controls the positioning of graphical elements such as cursors and icons on the screen A sel-calibration subsystem 90 periodically initiates commands to the oscilloscope digitizer and plugins which cause them to self-calibrate.

All of the above-described subsystems of the steady state system 76 are tasks which run continuously during normal "steady state" oscilloscope operation, and most of these tasks can be "configured" to perform their functions in a variety of ways by setting the values of various oscilloscope operating state configuration parameters 77. For example the waveform calculation subsystem 84 can be configured to simultaneously calculate from 1 to 8 waveform data sequences, and the expression controlling calculation of each sequence may be changed by a user. Once a subsystem of steady state system 76 is configured to operate in a particular manner, the subsystem continues to operate in such manner until it is reconfigured by changing the values of appropriate configuration parameters 77.

The digitizer, display controller and plugin hardware subsystems each may be also configured according to various configuration parameters 77 to operate in a particular "steady state" mode of operation and will continue to operate in such mode until the configuration parameters controlling subsystem operation are changed. For example the digitizer may be configured to digitize a particular set of input waveforms utilizing triggering events, sampling rates and other controllable operating conditions determined by input configuration data, and will continue to do so until the digitizer is supplied with new configuration control data which changes some aspect of its operation.

The interboard communication system 78 comprises drivers for providing communication between the microcomputer 44 and various hardware subsystems of the oscilloscope, including a set of drivers 85 for handling communication with the plugins, a driver 87 for handling communication with the digitizer, and a driver 89 for handling communication with the display controller. The drivers are utilized to transmit configuration control commands to the hardware subsystem when values of configuration parameters 77 affecting operation of these subsystems change. The drivers are also utilized to transmit data between hardware and software subsystems. Data, including waveform data sequences, calculation results, messages and the like, are passed between the hardware and software subsystems by storing the data in data files 79 in RAM 48 accessed by the drivers in the interboard communication system 78 and software subsystems.

The operating state of each software subsystem of steady state system 76, as well as the operating state of each hardware plugin, digitizer and display controller subsystem, may be configured by an operator utilizing the touch screen, knobs or pushbuttons on the oscilloscope main front panel, or by a remote control system such as an external computer utilizing data transmitted over the GPIB or RS232 buses. As discussed hereinabove, the I/O circuitry 50 of FIG. 2 transmits messages to the microcomputer 44 in response to control signals or messages from these sources. The control interface system 72 of FIG. 3 provides a set of interface subsystems operating as tasks within operating system 70, and each subsystem is adapted to respond to messages produced by the I/O circuitry 50 by generating a predetermined "configuration command". Each configuration command invokes a procedure for changing the value of one or more configuration parameters 77 so as to reconfigure one or more subsystems of the steady state system 75 and/or one or more of the oscilloscope hardware subsystems for selected modes of operation. Each command also conveys a block of "configuration data" utilized by the invoked procedure when setting the values of the configuration parameters 77. Features of oscilloscope 10 are also set forth and claimed in copending U.S. patent application Ser. No. 06/918,430 filed Oct. 14, 1986.

A human interface management subsystem 92 of control interface system 72 manages the display of menus on the oscilloscope screen and also produces configuration commands in response to messages from interface circuitry 50 indicating touch screen 19 menu selections or indicating operation of oscilloscope front panel pushbuttons 18 of FIG. 1. A knob interface susbystem 94 produces configuration commands in response to messages from the I/O circuitry indicating the direction and amount of rotation of either one of the two front panel knobs 16 of FIG. 1. A set of three plugin interface subsystems 96, 98 and 100 produces configuration commands in response to I/O interface circuitry messages indicating operation of knobs or pushbuttons on the plugins 20, 22 and 24 of FIG. 1, and an "ASCII" interface subsystem 102 produces configuration commands in response to messages from the I/O interface circuitry based on messages carried over the GPIB and RS232 buses. Operating system 70 stores the configuration commands produced by interface subsystems 92, 94, 96, 98, 100, and 102 of control interface system 72 in RAM 48 of FIG. 2 in the form of data queues 104–109, respectively, and each command remains stored in a queue until executed.

Each configuration command comprises a block of data structured in a similar fashion, including the data fields as shown in Table I below:

TABLE I

| Field Name | Field Length | Parameter Type | Function |
| --- | --- | --- | --- |
| errorMb | 16 bits | boolean | return error |
| doneSem | 16 bit | boolean | return done semaphore |
| cmdId | 16 bit | integer | command identifier |
| key | 16 bit | integer | trace number |
| enumArg | 16 bit | boolean | any purpose |
| si | 16 bit | signed int. | any purpose |
| ui(3) | 3 × 16 bit | 3 integers | any purpose |
| nrx | 64 bit | flt. pt. | any purpose |
| slot | 16 bit | integer | slot identifier |
| data | 32 bit | pointer | pointer to stored data |
| len | 16 bit | integer | length of stored data |

Although each command includes each of the data fields listed in Table I, a procedure invoked by any particular command may not utilize data contained in every field. The errorMb and doneSem fields contain data indicating whether the control interface subsystem producing the command wants the command execution system 74 to return "error information" or a "done semaphore" (as described hereinbelow) in the course of executing a command. Data in the cmdId field identifies the procedure to be invoked by the command. The key field is used to identify a particular waveform data base element (e.g. waveform trace) in commands affecting waveform displays, such as for example a command to cease displaying a waveform. The enumArg, si, ui, and nrx fields convey various types of parameters (booleans, signed and unsigned integers and floating point numbers) which may describe some particular feature of subsystem configuration depending on the nature of the procedure being invoked. For example, in a command to change the background intensity of the display in response to knob rotation, the intensity may be increased or decreased according to the value of data in the si field, and most of the other fields may be unused.

The slot field listed in Table I contains an integer whose value identifies a particular plugin, and this field is used in commands which affect plugins. The data field is a pointer to an initial location in RAM 48 of FIG. 2 where a block of data is stored and the len field indicates the number of memory addresses the block of data consumes. The data and len fields are used in commands invoking procedures requiring large blocks of input data. For example, when the human interface management subsystem 92 produces a command which invokes a procedure for configuring the waveform calculation subsystem 84 so as to calculate a waveform according to a particular expression, information defining the expression is not conveyed in the command but is rather stored in RAM 48, and the data and len fields conveyed in the command identify the storage location of the expression information. The invoked procedure acquires this information from memory in the course of executing the command.

The command execution system 74, operating as an additional task within the operating system 70 environment, executes procedures identified by configuration commands stored in queues 104–109, such procedures being executed one at a time according to a predetermined arbitration scheme. Each command is executed by calling a subroutine identified by the command, the subroutine modifying configuration parameters 77 controlling operation of one or more subsystems of steady state and/or hardware subsystems. The command execution system 74 includes a set of command execution modules (subroutines) 112, one for carrying out each type of configuration command, and an arbitrator routine 110 for checking each queue 104–109 according to a predetermined priority system and invoking operation of the appropriate command execution module whenever a command is encountered in one of the queues. If no command is encountered after checking all of the queues, arbitrator operation is suspended until a semaphore 114, a flag maintained by the operating system, is set. Each one of the control interface system 72 subsystems sets semaphore 114 whenever it produces a configuration command for storage in a queue and, when the semaphore is set while arbitrator operation is suspended, operating system 70 "awakens" the arbitrator 110, which rechecks all of the queues for commands, invokes command execution modules 112 as necessary to execute all commands encountered in the queues, and thenr esets the semaphore 114.

When a command execution module 112 is invoked by arbitrator 110, it may reconfigure one or more selected hardware subsystems by changing configuration control parameters 77 and invoking operation of the appropriate driver 85, 87 and 89 in the interboard communication system 78 as necessary to convey configuration data to the hardware subsystems. A command execution module 112 may also reconfigure one or more of the subsystems of steady state system 76 simply by changing values of appropriate configuration parameters 77. The configuration parameters are monitored by the steady state subsystems, each of which operates continuously during normal oscilloscope operation, and changes in certain configuration parameters automatically result in a change in operation modes of one or more steady state subsystems.

Various command execution modules 112 may be adapted to detect and report errors encountered in the course of attempting to reconfigure oscilloscope hardware or software subsystems, such as for instance errors arising out of inappropriate data in configuration command data fields, or out of failure to carry out reconfiguration due to some conflicting prior state of the oscilloscope. When an error is detected, a command execution module may return an error indication to the arbitrator 110, and the arbitrator will store a "Display Message Menu" command in either of a pair of "mail-boxes" 116, sections of RAM 48 reserved for transmitting information to human interface management subsystem 92 and to the ASCII interface subsystem 102. This message causes the human interface management subsystem to display an error message on the screen or causes the ASCII interface subsystem to transmit an error message over the RS232 of GPIB buses.

When the command execution module 112 has completed its operation, the arbitrator 110 checks the state of a "done" semaphore in the mailbox 116 of the human interface subsystem 92, and if the flag is not set, it will set the flag and place an "Update" command in the mailbox 116. According to the present invention, when the human interface management subsystem 92 detects an Update command, it updates the menu display to account for any changes required by the change in system operating state. Thereafter the human interface management subsystem 92 removes the Update command from its mailbox, and resets the done flag. Thus a new Update command is placed in its mailbox 116 only when no Update command is already stored therein.

While human interface management subsystem 92 can change the operating state of various steady state and hardware subsystems of the oscilloscope by transmitting configuration commands to the command execution system 74, which in turn adjusts the values of configuration parameters 77, the subsystem controls display of menus on the oscilloscope screen by storing menu display control data 79 in RAM and invoking display communication driver 89 to cause that data to be sent to the display controller. The display communication driver 89 initially transmits menu display control data to the waveform memory 32 of FIG. 2 for storage therein, and subsequently causes the memory arbitrator 34 to transfer the data to display controller 34. Display controller 34 utilizes this data to create bit maps of menus superimposed over the waveform bit map in display memory 38. Thereafter, when the display controller updates the display on screen 17, the appropriate menus are displayed.

According to the present invention, the human interface management (HIM) subsystem 92 may automatically change the menu display when the operating state of the oscilloscope changes. When the HIM subsystem 92 detects an Update command in its mailbox 116, it checks values of various configuration parameters 77 to see if they have been altered, thereby indicating that the state of the oscilloscope has changed. If so, the HIM subsystem 92 may change the menu display so that menus appropriate to the new oscilloscope operating state are displayed while inappropriate menus are removed from the display. This reduces the need for an operator to tell the oscilloscope (by means of menu selections, pushbuttons and the like) which menus are to be displayed when the operating state of the oscilloscope changes. The human interface management system 92 is adapted not only to automatically determine the menus that are to be displayed when the oscilloscope operating state changes, but it is also adapted according to the present invention to change individual menus so as to add menu items which are appropriate, and remove menu items which are inappropriate to the new oscilloscope operating state, and to change individual menu items to indicate aspects of the new operating state.

In the preferred embodiment of the invention, the human interface management subsystem 92 provides six types of menus. A "permanent selection menu" is not actually displayed on the screen; rather it is formed by the pushbuttons 18 on the front panel of the oscilloscope 10 as shown in FIG. 1. One pushbutton controls whether HIM subsystem 92 responds to touch screen input. Each of five other pushbuttons 18 cause the HIM subsystem 92 to display a particular menu on screen 17, the name of the menu being printed on the oscillscope front panel 14 next to the pushbutton which controls it. The remaining pushbuttons 18 on the oscilloscope front panel cause the human interface management subsystem 92 to generate configuration commands which configure the oscilloscope to carry out specific operations, such as for example starting or stopping the digitizer, changing digitizer accuracy, transmitting bit-map data over the RS232 bus so that external equipment can create a hardcopy picture of the display, etc.

"Status menus" show various oscilloscope operating parameter values. Only one status menu 21 may be displayed at any time, and it is displayed in the lower left corner of screen 17. A "knob menu" 23 is displayed in the lower right hand corner of screen 17. The knob menu shows the value of parameters currently controlled by knobs 16. Whenever one of the knobs 16 is rotated, knob interface subsystem 94 of FIG. 3 generates a configuration command which causes a change to the value of the parameter currently controlled by knob according to the amount of knob rotation. When human interface management subsystem 92 detects an Update command in its mailbox, it checks the configuration parameters and, on finding a change to the parameter controlled by the knob, it updates the knob menu accordingly.

The oscilloscope may operate in either dual or single axis modes. When the oscilloscope is in the single axis mode, an "axis menu" 25 is displayed along the left and upper edges of the "waveform area" 27 of the screen 17 above the status and knob menus. When the oscilloscope is in the dual axis mode, the axis menu is displayed along the left and upper edges of both upper and lower halves of the waveform display area. The axis menus are used to reassign the knob function for control of vertical and horizontal waveform positioning, to display positions of cursors and for other purposes relating to the waveform display.

A "popup menu" 29 may be superimposed over the waveform display area 27 to permit an operator to change various operating parameters of the oscilloscope, utilizing the touch screen to make menu selections, or to indicate values of various oscilloscope operating parameters. For example, a popup menu may be used to reassign the function of knobs 16, to select expressions for synthesizing waveforms, to select which stored waveforms are to be displayed, etc. A popup menu may be displayed in response to a selection made from another menu, in response to operation of a pushbutton, or in response to any other action which changes the oscilloscope state. Only one popup menu is displayed at a time and the operator can remove a popup menu by touching any area of the screen not covered by the popup menu.

A "message menu" 31 may be displayed in the upper two lines of the display, superimposed over the axis menu and waveform display. This menu is utilizes to display messages conveyed in the previously mentioned Display Message Menu commands generated by the command execution system 74 or by the operating system 70 of FIG. 3. The operator may remove a message menu from the display by touching any part of the screen. If a new Display Message Menu command is received while the message menu is displayed, human interface management subsystem 92 automatically replaces the displayed message with a message indicated by the new command.

Figure 4:
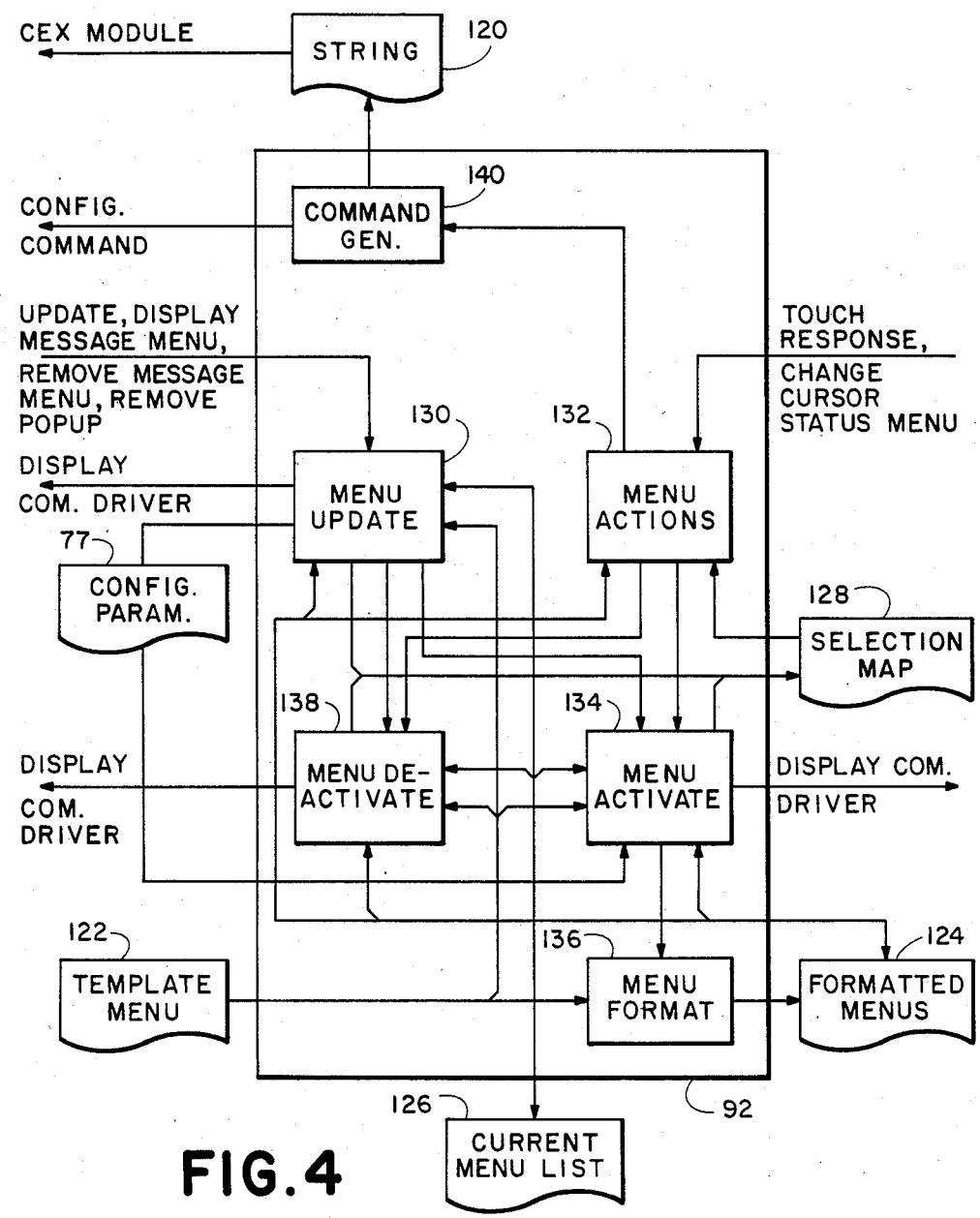
FIG. 4 is a data flow diagram showing detailed operation of the human interface subsystem of the software of FIG. 3.

Referring to FIG. 4, a data flow diagram depicts detailed operation and architecture of human interface management subsystem 92 of FIG. 3. Subsystem HIM 92 accesses various types of data files stored in ROM 46 and RAM 48 of FIG. 2, including the configuration parameters 77, "string files" 120, a "current menu list" 126, "formatted menus" 124, a "selection map" 128, and a set of "template menus" 122. The string files 120 store data utilized by command execution modules 112 of FIG. 3 in the course of executing a command generated by human interface management subsystem 92 when the data cannot be conveyed in the standard command data fields shown in Table I. In such case, HIM subsystem 92 stores the data in a string file 120 and the command conveys information in the "data" and "len" fields of Table I indicating the location of the string file in RAM 48. The command execution module 112 responding to the command thereafter obtains the data from the string file. A string file 120 is used, for example, to convey information regarding user-defined expressions for guiding the operation of the waveform calculation subsystem 84 of FIG. 3.

Characteristics of each menu which may be displayed on the screen are described by a corresponding "template menu" 122, one template menu 122 being stored in ROM 46 for each displayable menu. Each template menu includes instructions for determining when the menu is to be displayed, what items may be included in the corresponding menu, what each menu item is to look like when displayed, where on the screen the menu is to be displayed, what operations are carried out when a menu item is selected, and other aspects of the menu as described in more detail hereinbelow. Each template menu 122 describes a range of characteristics a particular menu might have when actively displayed depending on the operating state of the oscilloscope. In order to initially establish the actual characteristics of a menu to be displayed during a given current operating state of the oscilloscope, HIM subsystem 92 reads the data contained in the corresponding template menu 122, determines from this data what configuration parameter 77 values identify oscilloscope operating states relevant to the menu, reads these parameter values, and then creates a corresponding "formatted menu" 124 data file in RAM.

Each formatted menu includes much of the information in its corresponding template menu and also includes data reflecting relevant aspects of the current state of the oscilloscope so as to enable HIM subsystem 92 to determine whether the menu is currently to be displayed, exactly how the menu should be displayed, how the HIM subsystem 92 is to respond to menu selections, etc. When HIM subsystem 92 determines that an undisplayed menu is to be displayed, it creates or updates the corresponding formatted menu as necessary to reflect the current operating state of the oscilloscope, obtains menu display control data from the formatted menu file, and passes it to the display communication driver subroutine 89 of FIG. 3. The display communicatin driver then transmits the display control data to the display controller 36 of FIG. 2 via waveform memory 32 and memory arbitrator 34 as previously described. The display controller 36 updates the menu display.

Menus are initially formatted the first time they are to be displayed. Menus which do not change size (i.e., the number of menu items) in response to changes in oscilloscope operating state are treated as "static" menus, while menus which do change size are treated as "dynamic" menus. Most menus are "static", meaning that when the menu is removed from the display, the formatted menu is not discarded but is kept in RAM and modified as necessary whenever configuration parameter values affecting the menu change, even though the menu is not currently displayed. Thus whenever a previously formatted static menu is redisplayed, it is not necessary to reformat the menu from its template menu, although it may be necessary to update the formatted menu to reflect changes in oscilloscope operating state. On the other hand, when a "dynamic" menu is removed from the display, its formatted menu is discarded and HIM 92 must recreate the formatted menu from the template menu whenever the dynamic menu is subsequently redisplayed. A new formatted menu must also be created whenever a change in oscilloscope operating state affects a currently displayed dynamic menu.

The current menu list 126 is a list of pointers to ROM storage locations of template menus 122 corresponding to currently formatted menus 124, and the selection map 128 is a data structure HIM subsystem 92 uses to determine its response to touch screen input. HIM subsystem 92 updates current menu list 126 whenever a menu is formatted and whenever a menu is added to or removed from the display. The selection map 128 divides the touch screen into a set of "touchable" areas, and includes for each touchable area, as well as for each pushbutton on the oscilloscope front panel, a pointer to a set of instructions in a particular formatted menu 124. It is these instructions which tell HIM subsystem 92 what to do when a particular area of the screen is touched. Whenever the menu display is changed by adding, removing or modifying a menu, HIM subsystem 92 response to a screen touch at one or more locations on the touch screen may change. Thus when the menu display is changed, pointers in selection map 128 are usually changed.

The human interface management subsystem 92 of FIG. 4 responds to six types of commands which may be placed in its mailbox 116, including Updata, Touch Response, Display Message Menu, Remove Message Menu and Remove Popup Menu commands. Each message is of the format shown in Table II below.

TABLE II

| Field Name | Field Length | Parameter Type |
|---|---|---|
| ComplSem | 16 bits | semaphore |
| Cmd | 16 bits | integer |
| Origin | 16 bits | integer |
| X | 16 bits | integer |
| Y | 16 bits | integer |
| Key | 16 bits | integer |
| ErrorArray | 110 × 16 bits | characters |

In all messages, data in the Cmd field identifies the message type and data in the ComplSem field identifies semaphore, if any, that HIM subsystem 92 should signal when message processing is complete.

A "menu actions" routine 132 of human interface management subsystem 92 responds to Touch Response commands. The I/O circuitry 50 of FIG. 2 sends a Touch Response command whenever the touch screen or a front panel pushbutton is operated. The X and Y fields of the command identify the touch screen area or pushbutton that was operated. The I/O circuitry 50 can also send a Touch Response command in response to a message transmitted over the GPIB or RS232 buses to allow an external control system such as a computer to simulate touch screen or push button operation. The Origin field indicates whether the command came from the remote source. The Key and ErrorArray fields are not used by the Touch Response command.

In response to a Touch Response command, the menu actions routine 132 determines from pointers in selection map 128 the storage location of an appropriate "Action" data field in a formatted menu 124 providing instructions for an action to be taken. If HIM subsystem 92 is to display a menu in response to a Touch Response command, the menu actions routine 132 calls a menu activate routine 134 which checks the current menu list 126 to determine whether the menu to be displayed is currently formatted. If the menu is not currently formatted, menu activate routine 134 calls a menu format subroutine 136 which copies selected information from the template menu 122 into a new formatted menu 124 file. Thereafter, the menu activate routine 134 reads data in the formatted menu file to determine which configuration parameters 77 are relevant to the menu, reads those configuration parameters, and then adjusts data in the formatted menu 124 according the current values of the configuration parameters.

Next, the menu activate routine 134 generates menu display control data based on information in the formatted menu 124 and passes it to the display communication driver 89 of FIG. 3. The driver causes the display controller 36 of FIG. 2 to create the new menu display according to the display control data. The menu activate routine 134 also changes the current menu list 126 to add a pointer to the template menu corresponding to the newly formatted and displayed menu and changes pointers in the selection map 128 to point to appropriate action instructions in the new formatted menu 124.

The menu actions routine 132 may remove a menu from display in response to a Touch Response command. In such case the menu actions routine 132 calls a menu deactivate routine 138 which checks the current menu list 126 to locate the template menu 122 for the menu to be removed from display, checks the template menu for a pointer to the corresponding formatted menu 124, generates display control data based on information in the formatted menu, and passes the data to the display communication driver. The display communication driver thereafter passes this data to the display controller causing it to remove the menu from the display. The menu deactivate routine 138 modifies the selection map 128 to account for removal of the menu display. In the case of a static menu, the menu deactivate routine 138 also modifies the current menu list 126 to indicate that the menu is no longer active. In the case of a dynamic menu, the menu deactivate routine "destroys" the formatted menu 124 by deleting references to the formatted menu from the current menu list 126.

Instructions referenced by the selection map 128 may tell the menu actions routine 132 to generate a configuration command so as to reconfigure the oscilloscope operating state. In response to such an instruction from the selection map, the menu actions routine 132 calls an appropriate command generator subroutine 140 stored at a ROM location indicated by a pointer in a formatted menu 124, and the subroutine 140 generates one or more commands, utilizing a string file 120 when necessary to pass large blocks of data to the command execution system.

The arbitrator 110 of FIG. 3 places an Update command (utilizing only the ComplSem and Cmd fields) in mail box 116 when a command execution module 112 completes a response to a configuration command, if no Update command is pending in the mailbox. HIM subsystem 92 may add a menu to the display, may remove a menu from the display, or may modify a displayed menu in response to the Update command. A "menu update" routine 130 of HIM 92 responds to the Update commands by checking all of the template menus 122 to determine which parameters 77 may affect the menu display. It then reads the appropriate parameters to determine what menus should be displayed based on the values of the parameters and checks the current menu list 126 to determine what menus are currently formatted and what menus are currently displayed. If the menu update routine 130 determines that a currently displayed menu should no longer be displayed, it calls the menu deactivate routine 138 to remove the menu from thedisplay in a manner previously described. If the menu update routine 130 determines that a menu which has not yet been formatted is to be added to the display, it calls the menu activate routine 134 which formats and activates (displays) the menu in a manner previously described.

The menu update routine 130 also inspects the contents of each formatted menu 124 to determine if the new configuration parameter 77 values would cause any change to the formatted menu, and, in the case of a static menu, changes the formatted manu accordingly. If the static menu is currently displayed, the menu update routine 130 generates display control data based on the information in the formatted menu 124 and passes it to the display communication driver so as to update the display. For a currently displayed dynamic menu, when the menu update routine 130 determines from data in the formatted menu that the new configuration parameter values require a change to the formatted menu, the menu update routine calls the menu deactivate routine 138 to remove the existing displayed menu and then calls menu activate routine 134 to create a new formatted menu and to redisplay the menu based on data in the new formatted menu.

A Display Message Menu may be stored in the HIM subsystem 92 mailbox by the command execution system 74 or by the operating system 70 of FIG. 3 and is utilized to initiate display of a message menu. In this command the ErrorArray field contains the ASCII text of the message to be displayed and ends with a NULL character. The Display Message Menu command does not use the Origin, X, Y or Key fields. The menu update routine 130 responds to a Display Message Menu command by calling the menu deactivate routine 138 to remove any currently displayed message menu and then calling the menu activate routine to format and display a new message menu containing the message conveyed in the command.

A Remove Message Menu command, using only the CmplSem and Cmd fields, may be stored in the HIM mailbox to cause menu update routine 130 to call the menu deactivate routine 138 to remove a message menu. A Remove Popup Menu command placed in the HIM subsystem mailbox, also utilizing only the ComplSem and Cmd fields, cause the HIM subsystem 92 to remove a popup menu from the display by calling the menu deactivate routine 138.

FIGS. 5-18 show details of the various data structures accessed by HIM subsystem 92 of FIG. 4 in the course of responding to the above described commands. In FIGS. 5-18 each data structure is depicted as a list including data field names in a left hand column and corresponding data field types in a right hand column. With respect to data types, "Short" indicates a 16 bit integer, "Bool" indicates a boolean, "Fn Ptr" indicates a pointer to a RAM or ROM storage location of a set of instructions, "PTR" indicates a pointer to a RAM storage location of a data structure, "Union" indicates a data substructure containing variable data fields depending on menu type, and "Struct" indicates a data substructure which does not vary with menu type.

Each template menu 122 and each formatted menu 124 includes a "header" data structure and a set of "entity" data structure, and FIGS. 5 and 6 show the header structures for the template and formatted menus, respectively. The template menu header of FIG. 5 comprises a HIMMnuTmplStr structure including a MnuType field indicating the menu type (permanent, status, knob, axis, popup or message) and a LckFlg field indicating whether the menu may be selected by operation of a front panel pushbutton even if the front panel is "locked". (A configuration command produced by the ASCII interface subsystem 102 of FIG. 3 may cause a command execution module 112 to set a configuration parameter 77 which tells the menu update routine 130 of FIG. 4 to deactivate various "menus" associated with the front panel pushbuttons and touch screen, and the LckFlg field of each menu indicates whether menu display is to be inhibited by such a command.) A DynFlg field indicates whether the menu is dynamic or static and a DispFn field points to a RAM location containing a boolean indicating whether the menu is currently displayed. An EntryFn field contains a pointer to a ROM storage location containing instructions for actions to be performed when a menu is first displayed (such as, for example, initiating a configuration command to reassign a knob function), and an ExitFN contains a pointer to a ROM storage location containing instructions for an action to be performed when a menu is removed from the display. A Formatted field contains a pointer to a RAM storage location containing another pointer to the RAM storage location of the corresponding formatted menu header. This "double pointer" is used because the template menu, being in ROM, cannot contain a varying datum.

When the menu is formatted, the menu format routine copies the MnuTyp, DispFn, EntryFn, and ExitFn template menu fields into the formatted menu header structure HIMMnuFmtStr, shown in FIG. 6, and the menu activate routine adds several other fields. MnuLft and MnuTop fields identify the location on the screen where the upper left hand corner of the menu is to be displayed. An InstanceNext field indicates an "instance number" used by HIM subsystem 92 to identify the first "menu entity" of the collection of menu entities associated with the menu. ("Menu entities" are described in detail hereinbelow.) If the menu is a status menu, a MnuUniq field contains information indicating what functions knobs 16 of FIG. 1 would control if the status menu were to be displayed. If the menu is a popup menu, the MnuUniq field contains data indicating the area of the screen to be covered by themenu when displayed. An EntChn field is a pointer to the RAM storage location first formatted entity of the entities included in the formatted menu.

Several types of "menu entity" data structures may be included in a template or formatted menu. A selector entity includes data defining a touchable area on the screen where a "selector" (i.e. a menu item) may be displayed, data indicating what text or graphical symbol representing the selector is to be displayed, data including the circumstances under which the selector is to be included in a displayed menu, and pointers to memory locations containing instructions for carrying out actions in response to touch screen or pushbutton operation. One selector entity is included in the template menu for each menu selector and a corresponding selector entity is included in the formatted menu. FIG. 7 shows the structure of a selector entity in the template menu and FIG. 8 shows the structure of a selector entity in the formatted menu.

With reference to the template menu selector entity (HIMSelTmplStr) of FIG. 7, an EntType field contains data indicating that the entity is a selector entity. A StevesArg field contains an integer constant passed to boolean functions called by HIM subsystem 92 to determine whether the selector is to be displayed, highlighted, or selectable, to determine what text or icon is to be displayed in the field, and to determine what actions are to be taken in response to selection. A DispFn field includes a pointer to the boolean function which determines whether or not the selector associated with the entity is currently displayed based on current values of configuration parameter data and on data included in the StevesArg field. A PlaceHold field contains data indicating whether or not the selector's position in a displayed menu is to be held (i.e. left blank) when the selector is not displayed, or whether the menu display is to be reformed such that no gap is to be shown between selectors that are displayed. (The latter choice is appropriate only for dynamic menus which are reformatted before each display update.)

In some oscilloscope operating states it may be desirable to display a selector but to prevent the HIM subsystem 92 from responding to its selection. A SlctFn field contains a pointer to a boolean function which determines whether or not the selector is currently "selectable" (i.e. whether HIM subsystem 92 will respond to its selection) based on the value of StevesArg and current configuration parameter data. When a selector is selectable it may be highlighted, and a HilitFn field contains a pointer to a boolean function indicating whether the selector should be highlighted based on the values of StevesArg and configuration parameters. ColorExcep, FColorIndex, and BColorIndex fields control selector color while Width and Height fields control selector size. PlaceCode, PlaceX and PlaceY fields contain data indicating how the selector is to be positioned on the screen, whether at an absolute screen position, at an absolute position within the menu, at a position relative to some other selector, etc. An Overlayed field indicates whether the selector shares its screen location with another entity of the menu on a mutually exclusive basis. HIM subsystem 92 uses the Overlayed information in determining whether to update the menu display upon changed system status.

OutFldFn is a pointer to an "output field" function which determines from StevesArg and current configuration parameter values whether an output field (data) is to be displayed within the selector, and OutFldChr is a parameter indicating where in the selector the data is to be displayed. Whenever HIM subsystem 92 activates a menu for which an output field function is specified, HIM subsystem 92 executes the output field function. The output field function causes HIM subsystem 92 to send a message to the steady state system causing the steady state system 76 to initiate display of the value of a particular datum specified in the message, such as, for example, the value of waveform measurement data produced by the measurement subsystem 86 of the steady state system 76 of FIG. 3. The datum value is displayed within a particular selector at a screen position indicated by the message. Thereafter, the steady state system automatically updates the datum value display within the selector whenever the datum value changes, without requiring further action on the part of HIM subsystem 92. When the HIM subsystem 92 subsequently removes the menu from the display, it sends another message to the steady state system, telling it to stop updating the datum value display. A TxtIcon field contains data indicating whether text or graphics to be displayed in the selector, and a SelUniq field contains pointers to data which enables the HIM subsystem 92 to determine the nature of such test or graphics.

An Actions substructure (HIMActPtrStr) of HIMSelTemplStr contains data indicating menu and non-menu actions to be performed when the selector is selected. Menu actions may include displaying a message or popup menu or removing a popup menu. Non-menu actions include, for example, generating a particular configuration command. The Actions structure HIMActPtrStr includes a NewMsg pointer to a template message menu, a NewPopup pointer to a template popup menu, a DelPopup boolean indicating whether a currently displayed popup menu is to be removed from the display, a NonMnuAct pointer to a command generator subroutine, and a NonMnuArg pointer to data which may be required by the command generator subroutine.

With reference to the formatted menu selector entity data structure (HIMSecFmtStr) shown in FIG. 8, the EntTyp, PlaceHold, Width, Height, DispFn, SlctFn, HilitFn, ColorExcep, FColorIndex, BColorIndex, OutFldFn, Actions, StevesArg, TxtIcon Overlayed and SelUniq fields are copied from the corresponding template menu. DispRslt, SlctRslt and HilitRslt fields contain booleans indicating whether the selector is to be displayed, selectable, or highlighted according to the results of functions (indicated by the DispFn, SlctFn and HilitFn fields, respectively) called by the menu activate routine when the menu is formatted. These fields enable the menu update routine 130 to determine whether the display status of the menu has changed. The OutFldX and OutFldY fields contain data indicating the absolute screen coordinates of an output field, if any, to be displayed, and the OutFldNo field contains data comprising a unique identifier for the output field to be displayed at the screen position indicated by the OutFldX and OutFldY screen coordinates. The OutFldX, OutFldY and OutFldNo data fields are passed to the steady state system when the menu is first displayed, as previously discussed so that the steady state system knows where to initiate display of output field datum. The OutFldNo is also passed to the steady state system when the menu is subsequently removed from the display in order that the steady state system knows which output field to stop updating. InstanceBase and InstanceMax are reference numbers used by HIM subsystem 92 to identify the selector associated with the menu entity. LocateX and LocateY contain the absolute screen coordinates of the upper left corner of the selector determined from the PlaceX and PlaceY fields of the template menu. Data in a BlankState field indicates which lines of the selector are blank and enables the selector to be redrawn more efficiently by not redrawing blank lines. Finally, a NxtEnt pointer indicates the storage location in RAM of the next entity of the menu. NextEnt pointers connect all the entities of a particular formatted menu into a linked list traversed by HIM subsystem 92 when obtaining data. (NextEnt pointers are not used in the template menus because the entities of each individual template menu are stored consecutively in ROM and no NxtEnt pointers are necessary.)

Another type of menu entity is a list entity which produces a rectangular array of selectors, one selector for each item on a list of variable length, such as, for example, a list of currently displayed waveforms. Referring to FIG. 9, showing the template menu list entity structure (HIMLsTmplStr), the list entity includes EntTyp, PlaceHold, DispFn, SlctFn, HilitFn, Overlayed, StevesArg, and Actions fields which have substantially the same functions as similarly named fields in the selector entity. EnvLft and EnvTop fields contain absolute screen coordinates of the list of selectors to be displayed. MaxEnvWidth and MaxEnvHight fields indicate the maximum width and height the selector list may attain, and SelWidth and SelHeight fields indicate the width and height of each selector (all selectors are the same size). LstLen is a pointer to a RAM location containing data indicating the number of items on the list (i.e. the number of selectors), and TxtFn is a pointer to the storage location of a function which determines from StevesArg the text that is to be displayed in each selector for each possible oscilloscope state as indicated by configuration parameter values.

The structure of a formatted list entity (HIMLstFmtStr) is shown in FIG. 10 and includes the EntTyp, PlaceHold, EnvLft, EnvTop, DispFn, SlctFn, HighlitFn, Overlayed, SelWidth, SelHeight, LstLen, TxtFn, Actions and StevesArg fields copied from the corresponding format menu list entity. It also includes NxtEnt, DispRslt, SlctRslt, HilitRslt, InstanceBase, InstanceMax, and BlankState fields containing data similar in purpose to similarly named fields of the previously described selector entity of FIG. 8. The formatted list entity also includes ActEnvWidth and ActEnvheight fields containing data including the actual width and height of the selector stack determined from the actual number of items on the list (LstLen) and the size of each selector. LstStart and LstAdjust fields contain parameters used to control selector array scrolling when the array is too large to be displayed in its entirety. In such case the last two selectors of the array cause the array to scroll up or down when selected.

Another menu entity which may be included in each menu is a ruling entity, the template and formatted forms of which are shown in FIGS. 11 and 12, respectively. The ruling entity is used to draw boxes around individual selectors, or groups of selectors, or to draw lines separating various parts of a displayed menu. The template menu ruling entity (HIMRulTmplStr) of FIG. 11 includes EntTyp, PlaceHold, DispFn and StevesArg fields similar in purpose to similarly named fields of the selector entity. The PlaceCode and PlaceData fields include data indicating relative or absolute starting and ending positions of a line, and a ColorIndex field indicates line color. The line type (solid, dotted, dashed, etc.) may be determined by a function to which the LineTypFn field points. Alternatively, line type may be specified by a LineTyp field indicating one of a set of predetermined line types. The formatted ruling entity structure (HIMRulFmtStr) of FIG. 12 includes NxtEnt, EntTyp, PlaceHold, DispFn, DispRslt, StevesArg, InstanceNo, ColorIndex, LineTypeFn, and LineTyp fields containing data utilized for the same purposes as similarly named data fields of previously described entities. In addition, StartX, StartY, EndX and EndY indicate absolute screen coordinates of line endpoints.

A text menu entity is utilized to describe text (or an icon) to be displayed in a non-selectable portion of a menu for annotation purposes. The template version of a text entity (HIMTxtTmplStr), shown in FIG. 13, includes EntTyp, PlaceHold, DispFn, PlaceCode, PlaceX, PlaceY, Overlayed, FcolorIndex, BColorIndex, StevesArg, TxtIcon and TxtUniq fields which have functions similar to previously described fields of the same name. A TxtLen field indicates the length of the text to be displayed, and a TxtUniq field contains a pointer to data in ROM describing the text or icon to be displayed. A formatted verions of the text entity (HIMTxtFmtStr), shown in FIG. 14, includes NxtEnt, EntTyp, PlaceHold, DispFn, DispRslt, PlaceX, PlaceY, Overlayed, FColorIndex, BColorIndex, StevesArg, TxtIcon, Txtlen, and TxtUniq fields similar to previously described fields of the same names.

An output field entity allows display of data such as measurement results produced by the steady state system. As previously mentioned, to establish display of data in an output field, HIM subsystem 92 sends a message to the steady state system and thereafter the steady state system automatically updates display of this data whenever the date value changes. The template version of an output field entity (HIMOutFmtStr), shown in FIG. 15, includes previously discussed EntTyp, DispFn, StevesArg, PlaceCode, PlaceX, PlaceY, FColorIndex, and BColorIndex fields. The index number for the entity is contained in an OutFldNo field. The formatted version (HIMOutFmtStr) of the output field entity, shown in FIG. 16, includes previously described NxtEnt, EntTyp, DispFn, DispRslt, StevesArg, PlaceX, PlaceY, FColorIndex, BColorIndex, and OutFldNo fields.

Only one menu of a particular type may be displayed, but more than one menu of a given type may be formatted and ready for display. The current menu list 126, indicating which formatted menus are concurrently active, is implemented as a family of RAM data structures as shown in FIG. 17. A master data structure (HIMCurLstStr) is a list of pointers ActMnu() to each of a set of HIMActMnuStr structures, one for each menu type. Each HIMActMnuStr structure includes a pointer PtrVal to the storage location of the header file of an active (displayed) formatted menu and a ConCur pointer to a HIMConCurStr structure comprising a list of pointers PtrVal() to the storage locations of the template menu header files of each formatted menu (including both active and non-active menus) of the type associated with the HIMActMnuStr structure.

The selection map 128 of FIG. 4 is implemented as a family of RAM and ROM structures as shown in FIG. 18. A master structure in ROM, HIMMnuDataStr, is a list of MnuDef() pointers to a set of HIMMnuDefStr structures in ROM, one MmuDef() pointer and one corresponding HIMMnuDefStr structure being provided for each menu type. Each HIMMnuDefStr structure includes Left, Top, Width, and Height fields which determine the size and position of each menu and a TchMap pointer to a HIMTchMapStr structure in RAM. One HIMTchMapStr structure is provided for each active menu and is updated whenever a new menu becomes active or a currently displayed menu is changed, the update being based on data in the corresponding formatted menu. Each HIMTchMapStr structure contains the LckFlg boolean associated with the menu and a set of pointers to HIMTchStr RAM structures, one for each selector in the menu. Each HIMTchStr structure contains an ActPtr pointer to a formatted entity Action structure, an EntryNum instance number identifying the selector, and PixLft, PixTop, PixRgt, and PixBot fields indicating the absolute screen position of each selector.

The above-described commands, routines, and data structures enable the human interface management subsystem to control the display of menus permitting an operator to adjust and monitor the operating state of an instrument such as an oscilloscope. Menus are selected to be added or removed from a display on a screen by HIM subsystem 92 in response to changes in the operating state of the instrument. When a configuration command is generated by the HIM subsystem 92 in response to menu item selection, or by any other source of configuration commands, the command execution system changes the values of one or more stored configuration parameters which control the operating state of the instrument and then transmits an Update command to HIM subsystem 92. In response to the Update command, HIM subsystem 92 determines the current operating state of the instrument by checking the values of the configuration parameters and determines from information provided in the template menus whether a menu is to be added or removed from the display depending on the current configuration parameter values. HIM subsystem 92 then updates the menu display so that menus appropriate for the operating state of the instrument are automatically displayed while irrelevant menus are automatically removed from the display, thereby minimizing the need for an operator to manually select appropriate menus to be displayed or removed from display. In addition, HIM subsystem 92 also adds, removes or modifies items in displayed menus in response to changes in the operating state of the instrument, according to instructions provided in the template menus, so that only those menu items which are appropriate to a given operating state are displayed.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for adjusting the operating state of an instrument of the type having display means for displaying menus and memory means for storing data including configuration parameters, the operating state of the instrument being determined according to values of configuration parameters stored in said memory means, the method comprising the steps of:

storing in said memory means menu data describing a plurality of menus each having a selectable menu item, said menu data including first instructions for selecting subsets of said plurality of menus for display by said display means according to values of said configuration parameters, and second instructions for modifying values of said configuration parameters in response to operator selection of the selectable menu item from said plurality of menus;

causing said display means to display a first subset of said plurality of menus;

modifying values of said configuration parameters according to said second instructions in response to operator selection of the menu item of the displayed first subset of said plurality of menus;

automatically selecting a second subset of said plurality of menus according to said first instructions and modified values of said configuration parameters; and causing said display means to display said second subset of said plurality of menus.

2. The method according to claim 1 wherein the step of causing said display means to display said second subset of said plurality of menus comprises the substeps of:

causing said display means to cease displaying menus of said first subset not included in said second subset; and causing said display means to begin displaying menus of said second subset not included in said first subset.

3. A method for adjusting the operating state of an instrument of the type having display means for displaying menus including operator selectable menu items, and having memory means for storing data including confiuration parameters, the operating state of the instrument being determined according to values of configuration parameters stored in said memory means, the method comprising the steps of:

storing in said memory means menu template data describing a plurality of menus having operator selectable menu items, said menu template data including first instructions for selecting menus from among said plurality of menus and for displaying at least one of the selected menus according to values of said configuration parameters stored in said memory means, and second instructions for modifying configuration parameter values stored in said memory means in response to operator selection of at least one selectable menu item of said plurality of menus;

storing in said memory means menu format data describing a first subset of said plurality of menus selected according to said first instructions;

selecting at least one of said first subset of said plurality of menus for display according to said first instructions; and causing said display means to display said at least one menu of said first subset selected according to said menu format data.

4. The method according to claim 3 further comprising the steps of:

modifying values of said stored configuration parameters according to said second instructions in response to the menu item selection made by an operator from said at least one displayed menu;

modifying said menu format data stored in said memory means such that the modified format data describes a second subset of said plurality of menus selected according to said first instructions and changed values of configuration parameters; and causing said display means to display at least one menu of said second subsest selected for display according to said first instructions.

5. The method according to claim 3 wherein said menu data stored in said memory means further includes instructions for selecting according to configuration parameter values menu items to be included in displayed menus.

6. The method accordin to claim 5 wherein said menu data stored in sid memory means further includes instructions for determining according to configuration parameter values the appearance of each menu item to be included in displayed menus.

7. A method for adjusting the operating state of an instrument of the type having display means for displaying menus, and having memory means for storing data including configuration parameter values, the operating state of the instrument being determined according to said configuration parameter values, comprising the steps of:

storing menu data in said memory means describing characteristics of a plurality of menus, each menu having an operator selectable menu item, said menu data including instructions associated with the operator selectable menu item for displaying the associated menu and for altering configuration parameter values when an operator selects the selectable menu item of the associated menu;

automatically selecting a first menu from among said plurality of menus according to the configuration parameter values stored by said memory means;

causing said display means to display said first menu according to said instructions included in said menu data;

adjusting configuration parameter values stored by said memory means according to said instructions included in said menu data in response to operator selection of the selectable menu item of the displayed first menu;

selecting a second menu from among said plurality of menus for display by said display means according to the adjusted configuration parameter values; and causing said display means to display said second menu according to said instructions included in said menu data.

8. A method for adjusting the operating state of an instrument of the type having display means for displaying menus, and having memory means for storing data including configuration parameter values, the operating state of the instrument being determined according to said configuration parameter values, comprising the steps of:

storing menu data in said memory means describing characteristics of a plurality of menus, each menu having an operator selectable menu item, said menu data including instructions associated with the operator selectable menu item for displaying the associated menu and for altering configuration parameter values when an operator selects the selectable menu item of the associated menu, for determining according to configuration parameter values which of said plurality of menus are to be displayed, and for selecting menu items to be included in each of said plurality of menus when displayed according to configuration parameter values;

selecting a first menu from among said plurality of menus according to the configuration parameter values stored by said memory means;

causing said display means to display said first menu according to said instruction included in said menu data; and adjusting configuration parameter values stored by said memory means according to said instructions included in said menu data in response to operator selection of the selectable menu item of the displayed first menu.

9. The method according to claim 8 wherein said menu data stored in said memory means includes instructions for determining according to configuration parameter values the appearance of each menu item included in each of said plurality of menu items when displayed.

* * * * *